US009263705B2

United States Patent
Seo et al.

(10) Patent No.: US 9,263,705 B2
(45) Date of Patent: Feb. 16, 2016

(54) SUCCESSIVE DEPOSITION APPARATUS AND SUCCESSIVE DEPOSITION METHOD

(75) Inventors: Satoshi Seo, Kanagawa (JP); Hisao Ikeda, Kanagawa (JP); Manabu Niboshi, Osaka (JP); Katsunori Mitsuhashi, Osaka (JP); Seiichi Mitsui, Osaka (JP); Yoshitaka Yamamoto, Osaka (JP)

(73) Assignees: Semiconductor Energy Laboratory Co., Ltd. (JP); Sharp Kabushiki Kaisha (JP)

( * ) Notice: Subject to any disclaimer, the term of this patent is extended or adjusted under 35 U.S.C. 154(b) by 915 days.

(21) Appl. No.: 13/418,837

(22) Filed: Mar. 13, 2012

(65) Prior Publication Data

US 2012/0237669 A1  Sep. 20, 2012

(30) Foreign Application Priority Data

Mar. 14, 2011 (JP) .................................. 2011-055533
Mar. 14, 2011 (JP) .................................. 2011-055534

(51) Int. Cl.
*H01L 51/00* (2006.01)
*H01L 51/56* (2006.01)
*H05B 33/10* (2006.01)
(Continued)

(52) U.S. Cl.
CPC .............. *H01L 51/56* (2013.01); *C09K 11/06* (2013.01); *H01J 9/22* (2013.01); *H01J 9/221* (2013.01); *H01L 51/5004* (2013.01); *H05B 33/10* (2013.01); *H01L 51/001* (2013.01); *H01L 51/5012* (2013.01); *H01L 51/5056* (2013.01)

(58) Field of Classification Search
None
See application file for complete search history.

(56) References Cited

U.S. PATENT DOCUMENTS 7,309,269 B2  12/2007  Yamazaki et al.
7,399,991 B2   7/2008  Seo et al.
(Continued)

FOREIGN PATENT DOCUMENTS

JP  2002-317262     10/2002
JP  2002-324673 A   11/2002
(Continued)

OTHER PUBLICATIONS

International Search Report for WO application PCT/JP2012/056951, mailing date Jun. 19, 2012.
(Continued)

*Primary Examiner* — Shamim Ahmed
*Assistant Examiner* — Bradford Gates
(74) *Attorney, Agent, or Firm* — Husch Blackwell LLP

(57) ABSTRACT

A successive deposition apparatus by which a reduction in the luminous efficiency of a light-emitting element can be suppressed even in high-speed deposition of a light-emitting layer thereof is provided. The apparatus includes: a second deposition chamber; a third deposition chamber coupled to the second deposition chamber; a transfer unit for transferring a substrate from second deposition chamber to third deposition chamber; plural third deposition sources arranged in the substrate transfer direction in the second deposition chamber; and a fourth and fifth deposition sources alternately arranged in the transfer direction in the third deposition chamber. In the third deposition chamber, the fourth deposition source is placed nearest to the second deposition source. The fourth deposition source contains a host material, and the fifth deposition source contains a dopant material. The HOMO level of a material of the third deposition source is adjusted to that of the host material.

6 Claims, 6 Drawing Sheets

(51) Int. Cl.
*H01J 9/22* (2006.01)
*C09K 11/06* (2006.01)
*H01L 51/50* (2006.01)

(56) References Cited

U.S. PATENT DOCUMENTS

| | | |
|---|---|---|
| 7,663,149 B2 | 2/2010 | Seo et al. |
| 7,794,857 B2 | 9/2010 | Tanabe et al. |
| 7,948,171 B2 | 5/2011 | Sakakura et al. |
| 8,110,509 B2 | 2/2012 | Yamazaki et al. |
| 8,821,963 B2 | 9/2014 | Tanaka et al. |
| 2001/0006827 A1 | 7/2001 | Yamazaki et al. |
| 2002/0113546 A1* | 8/2002 | Seo et al. ............ 313/504 |
| 2002/0155632 A1* | 10/2002 | Yamazaki et al. ........ 438/29 |
| 2003/0010288 A1 | 1/2003 | Yamazaki et al. |
| 2004/0031442 A1 | 2/2004 | Yamazaki et al. |
| 2004/0035360 A1 | 2/2004 | Yamazaki et al. |
| 2005/0064240 A1 | 3/2005 | Mishima et al. |
| 2008/0282984 A1 | 11/2008 | Yamazaki et al. |
| 2009/0134399 A1 | 5/2009 | Sakakura et al. |
| 2009/0269486 A1 | 10/2009 | Yamazaki et al. |
| 2010/0021624 A1 | 1/2010 | Yamazaki et al. |
| 2010/0301382 A1 | 12/2010 | Shitagaki et al. |
| 2010/0301383 A1 | 12/2010 | Shitagaki et al. |
| 2011/0132260 A1 | 6/2011 | Yamazaki et al. |
| 2011/0207255 A1 | 8/2011 | Sakakura et al. |

FOREIGN PATENT DOCUMENTS

| | | |
|---|---|---|
| JP | 2004-241188 A | 8/2004 |
| JP | 2005-123164 A | 5/2005 |
| JP | 2006-261109 | 9/2006 |
| JP | 2007-042875 A | 2/2007 |
| JP | 2007-266160 A | 10/2007 |
| JP | 2008-053664 A | 3/2008 |
| JP | 2009-212083 A | 9/2009 |
| JP | 2010-132978 | 6/2010 |
| JP | 2011-9205 | 1/2011 |
| JP | 2011-9729 | 1/2011 |
| JP | 2011-061016 A | 3/2011 |
| WO | WO 2007/111153 A1 | 10/2007 |
| WO | WO 2009/099002 A1 | 8/2009 |
| WO | WO 2010/137509 A1 | 12/2010 |
| WO | WO 2010/137733 A1 | 12/2010 |

OTHER PUBLICATIONS

Written Opinion of the International Searching Authority for WO application PCT/JP2012/056951, mailing date Jun. 19, 2012.

* cited by examiner material for forming hole transporting layer    dopant material host material material for forming hole transporting layer     dopant material auxiliary dopant material

SUCCESSIVE DEPOSITION APPARATUS AND SUCCESSIVE DEPOSITION METHOD

TECHNICAL FIELD

The present invention relates to an apparatus for successive deposition and a method for successive deposition, each using a deposition source.

BACKGROUND ART

As a conventional apparatus for manufacturing light-emitting elements, there is an in-line successive deposition apparatus (e.g. Patent Document 1). The in-line successive deposition apparatus has a plurality of deposition chambers which are arranged and coupled in a line and a transfer unit for transferring a substrate in the plurality of deposition chambers. Each deposition chamber has a plurality of linear deposition sources arranged in a line in a direction in which the substrate is transferred, and respective longer directions of the linear deposition sources are perpendicular to the substrate transfer direction and parallel to each other. With such an in-line successive deposition apparatus, an EL layer can be consecutively formed over an anode over a substrate with the plurality of deposition sources while transferring the substrate in the plurality of deposition chambers. The EL layer at least includes a light-emitting layer, and may further include a hole-injection layer, a hole-transport layer, an electron-transport layer, an electron-injection layer, etc. stacked as appropriate.

As for the structure of the light-emitting layer, a structure in which a dopant material which is a light-emitting substance is mixed with a host material is preferably employed to improve the luminous efficiency. As the host material, it is preferable to use a host material whose highest occupied molecular orbital level (hereinafter referred to as "HOMO level") is lower than that of the dopant material (or a light-emitting substance which emits visible light). The properties of the dopant material differ form those of the host material; thus, respective deposition sources need to be separately controlled in order to adjust the mixture ratio to deposit the light-emitting layer. In view of the above, in the above-descried in-line successive deposition apparatus, the linear deposition source of the dopant material and the linear deposition source of the host material are alternately disposed, so that the host material and the dopant material from respective linear deposition sources adjacent to each other are mixed to be deposited.

As the material of the anode, a metal, a metal oxide, or the like whose conductive property is higher than that of an organic compound is preferably used. This is because power loss can be suppressed. However, the work function of the metal, the metal oxide, or the like is higher than the HOMO level of any material of the light-emitting layer, and a difference therebetween makes it difficult to inject holes from the anode to any material of the light-emitting layer.

Hence, a structure is known in which a hole-transport layer is formed using a material whose HOMO level is lower than the work function of the anode and is higher than the HOMO level of any material of the light-emitting layer between the anode and the light-emitting layer to attenuate the difference between the work function of the anode and the HOMO level of any material of the light-emitting layer. Owing to the hole-transport layer, holes are transported readily via a material whose HOMO level is relatively high (e.g., light-emitting substance) of the light-emitting layer from the anode to the light-emitting layer.

However, in the in-line successive deposition apparatus, a single layer of the light-emitting substance, which is the dopant material, or a single layer of the host material whose HOMO level is the lowest in the materials of the light-emitting layer tends to be formed in, the interface between the hole-transport layer and the light-emitting layer. The single layer of the light-emitting substance leads to occurrence of concentration quenching of the light-emitting substance. Further, if the difference between the HOMO level of the material of the hole-transport layer and the HOMO level of the host material is large, the single layer of the host material leads to a reduction in hole transport from the hole-transport layer to the light-emitting layer. Accordingly, formation of the single layer causes an increase in the driving voltage of the light-emitting element or a reduction in luminous efficiency. In this specification, the "single layer" is a layer formed of a single material.

Particularly in the mass production of light-emitting elements, which requires efficient manufacturing, the deposition rate of the linear deposition source and the transferring speed of the substrate are set to high, whereby deposition is performed at high speed. However, such high speed deposition has a problem in that the above-described single layer is more likely to be formed in the interface between the hole-transport layer and the light-emitting layer.

[Reference]

Patent Document 1: Japanese Published Patent Application No. 2006-261109

DISCLOSURE OF INVENTION

It is an object of one embodiment of the present invention to suppress a reduction in the luminous efficiency of a light-emitting element even in high-speed deposition of a light-emitting layer of the light-emitting element. Further, it is an object of one embodiment of the present invention to suppress an increase in the driving voltage of a light-emitting element even in high-speed deposition of a light-emitting layer of the light-emitting element.

According to one embodiment of the present invention, a single layer between a hole-transport layer and a light-emitting layer is formed of a host material of the light-emitting layer. The HOMO level of the host material of the light-emitting layer is adjusted to that of a material of the hole-transport layer. The single layer of the host material is formed between the hole-transport layer and the light-emitting layer in this manner, whereby formation of a single layer of a light-emitting substance is prevented, so that a reduction in the luminous efficiency (concentration quenching) of a light-emitting element can be suppressed. Further, since the HOMO level of the host material is adjusted to that of a material of the hole-transport layer, the single layer of the host material does not lessen hole transport to the light-emitting layer, so that an increase in the driving voltage of the light-emitting element or a reduction in luminous efficiency can be suppressed.

One embodiment of the present invention is an apparatus for successive deposition including a first deposition chamber, a second deposition chamber coupled to the first deposition chamber, a transfer unit configured to transfer a substrate from the first deposition chamber to the second deposition chamber, a first deposition source placed in the first deposition chamber, and a second deposition source and a third deposition source which are placed in the second deposition chamber and arranged in a direction of the transfer. In the second deposition chamber, the second deposition source is placed nearest to the first deposition chamber. The HOMO level of a material of the second deposition source is adjusted to that of a material of the first deposition source, and the HOMO level of a material of the third deposition source is not adjusted to that of the material of the first deposition source.

In one embodiment of the present invention, the second deposition source and the third deposition source may be alternately disposed, and the material of the second deposition source may be a host material and the material of the third deposition source may be a dopant material.

Further, in one embodiment of the present invention, a first deposition layer may be deposited over the substrate with the first deposition source while transferring with the transfer unit the substrate in the first deposition chamber, and while transferring the substrate with the transfer unit from the first deposition chamber to the second deposition chamber, a host material layer may be deposited over the first deposition layer with the second deposition source, and a second deposition layer in which the host material is mixed with the dopant material may be deposited over the host material layer with the second deposition source and the third deposition source.

According to the embodiment of the present invention, the HOMO level of a host material contained in the single layer formed between the first deposition layer and the second deposition layer can be adjusted to that of the material of the first deposition layer since the HOMO level of the material of the second deposition source is adjusted to that of the material of the first deposition source.

Further, in one embodiment of the present invention, the material of the first deposition source may be a material for forming a hole-transport layer, and a material in which the host material is mixed with the dopant material may be a material for forming a light-emitting layer.

According to the embodiment of the present invention, the HOMO level of the material for forming the hole-transport layer can be adjusted to that of the host material, whereby a reduction in the luminous efficiency of a light-emitting element can be suppressed even when the light-emitting layer is deposited at high speed.

Further, in one embodiment of the present invention, the second deposition source, the third deposition source, and a fourth deposition source may be arranged in the transfer direction in the second deposition chamber. The third deposition source or the fourth deposition source may be positioned next to the second deposition source. One of the third deposition source and the fourth deposition source may contain a host material, the other thereof may contain a dopant material, and a material contained in the second deposition source may be an auxiliary dopant material.

Further, in one embodiment of the present invention, a first deposition layer may be deposited over the substrate with the first deposition source while transferring the substrate with the transfer unit in the first deposition chamber, and while transferring the substrate with the transfer unit from the first deposition chamber to the second deposition chamber, an auxiliary dopant material layer may be deposited over the first deposition layer with the second deposition source, and a second deposition layer in which the host material is mixed with the dopant material and the auxiliary dopant material may be deposited over the auxiliary dopant material layer with the second deposition source, the third deposition source, and the fourth deposition source.

According to the embodiment of the present invention, the HOMO level of the material of the first deposition source is adjusted to that of the auxiliary dopant material, which facilitates flow of holes from the first deposition layer into the auxiliary dopant material layer, which is a single layer containing a single material, formed between the first deposition layer and the second deposition layer.

Further, in one embodiment of the present invention, the material of the first deposition source is preferably a material for forming a hole-transport layer, and a material in which the host material is mixed with the dopant material and the auxiliary dopant material is preferably a material for forming a light-emitting layer.

According to the embodiment of the present invention, the HOMO level of the material for forming the hole-transport layer can be adjusted to that of the auxiliary dopant material, whereby an increase in the driving voltage of a light-emitting element can be suppressed even when the light-emitting layer is deposited at high speed.

One embodiment of the present invention is a method for successive deposition, in which a first deposition layer is deposited over a substrate with a first deposition source, a second deposition layer is deposited over the first deposition layer with a second deposition source, and a third deposition layer in which a material contained in the second deposition source is mixed with a material contained in a third deposition source is deposited over the second deposition layer with the second deposition source and the third deposition source. The HOMO level of the material of the second deposition source is adjusted to that of a material of the first deposition source.

In one embodiment of the present invention, the material of the second deposition source may be a host material, the second deposition layer may be a host material layer, the material of the third deposition source may be a dopant material, and the third deposition layer may be a layer in which the host material is mixed with the dopant material.

According to the embodiment of the present invention, the HOMO level of the host material contained in the single layer formed between the first deposition layer and the second deposition layer can be adjusted to that of the material of the first deposition layer since the HOMO level of the material of the first deposition source is adjusted to that of the host material.

Further, in one embodiment of the present invention, the substrate may be transferred from a first deposition chamber to a second deposition chamber in the deposition of the first deposition layer, the second deposition layer, and the third deposition layer, the first deposition chamber may include the first deposition source, and the second deposition chamber may include the second deposition source and the third deposition source which are arranged alternately in the transfer direction. In the second deposition chamber, the second deposition source may be placed nearest to the first deposition chamber.

Further, in one embodiment of the present invention, the material contained in the second deposition source may be an auxiliary dopant material, and the second deposition layer may be an auxiliary dopant material. The third deposition layer may be deposited with the second deposition source, the third deposition source, and a fourth deposition source, the material contained in the third deposition source may be a dopant material, a material contained in the fourth deposition source may be a host material; and the third deposition layer may be a layer in which the host material is mixed with the dopant material and the auxiliary dopant material.

According to the embodiment of the present invention, the HOMO level of an auxiliary dopant material layer, which is the single layer containing a single material and is formed between the first deposition layer and the second deposition layer, can be adjusted to that of the material of the first deposition layer since the HOMO level of the material of the first deposition source is adjusted to that of the auxiliary dopant material.

Further, in one embodiment of the present invention, the substrate may be transferred from a first deposition chamber to a second deposition chamber in the deposition of the first deposition layer, the second deposition layer, and the third deposition layer, the first deposition chamber may include the first deposition source, and the second deposition chamber may include the second deposition source, the third deposition source, and the fourth deposition source which are arranged in the transfer direction. In the second deposition chamber, the second deposition source may be placed nearest to the first deposition chamber.

Further, in one embodiment of the present invention, the first deposition layer may be a hole-transport layer, and the third deposition layer may be a light-emitting layer.

According to the embodiment of the present invention, the HOMO level of the material for forming the hole-transport layer can be adjusted to that of the host material, whereby a reduction in the luminous efficiency of a light-emitting element can be suppressed even when the light-emitting layer is deposited at high speed.

Further, according to the embodiment of the present invention, the HOMO level of the material for forming the hole-transport layer can be adjusted to that of the auxiliary dopant material, whereby an increase in the driving voltage of a light-emitting element can be suppressed even when the light-emitting layer is deposited at high speed.

Further, in one embodiment of the present invention, an electrode may be formed over the substrate before the first deposition layer is deposited thereon.

Applying one embodiment of the present invention, a reduction in the luminous efficiency of a light-emitting element can be suppressed even when a light-emitting layer of the light-emitting element is deposited at high speed.

Further, by applying one embodiment of the present invention, the HOMO level of a material for forming a single layer, which contains a single material and is formed between a first deposition layer and a second deposition layer, is adjusted to that of a material for forming the first deposition layer and the material for forming the first deposition layer is mixed in the second deposition layer, whereby flow of holes from the single layer into a light-emitting layer can be facilitated.

Still further, by applying one embodiment of the present invention, an increase in the driving voltage of a light-emitting element can be suppressed even when a light-emitting layer of the light-emitting element is deposited at high speed.

BEST MODE FOR CARRYING OUT THE INVENTION

Hereinafter, embodiments of the present invention will be described in detail with reference to the accompanying drawings. However, the present invention is not limited to the following description and it will be easily understood by those skilled in the art that the mode and details of the present invention can be variously changed without departing from the scope and spirit of the present invention. Therefore, the present invention should not be construed as being limited to the description in the following embodiments.

(Embodiment 1)

Figure 1A:
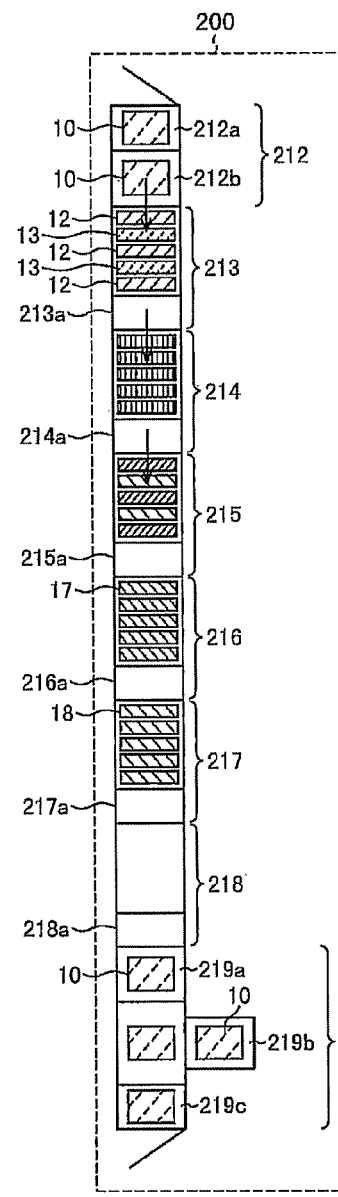
FIG. 1A is a schematic plane view of an entire structure of an in-line successive deposition apparatus according to one embodiment of the present invention.

A full view of an in-line successive deposition apparatus that is an apparatus for manufacturing a light-emitting element described in this embodiment is FIG. 1A. An in-line successive deposition apparatus 200 includes a pre-processing portion 212, a first deposition chamber 213, a second deposition chamber 214, a third deposition chamber 215, a fourth deposition chamber 216, a fifth deposition chamber 217, a sixth deposition chamber 218, and a post-processing portion 219.

The pre-processing portion 212 includes a loader 212a and a pre-processing chamber 212b. The loader 212a is a chamber where a plurality of substrates 10 which is carried in with the atmospheric pressure is stocked and the pressure is reduced with an evacuation unit, which is not shown, to a pressure under which deposition can be performed. Described in this embodiment is the case where a first electrode 11 is formed in advance over the substrate 10. Impurities attached to the substrate 10 are removed by pre-processing in the pre-processing chamber 212b. As examples of the pre-processing, vacuum heat treatment and UV irradiation treatment can be given.

The post-processing portion 219 includes a delivery chamber 219a, a sealing chamber 219b, and an unloader 219c. The delivery chamber 219a is a chamber for transferring the substrate 10 from the environment under the reduced pressure to an environment under the atmospheric pressure, and has an evacuation unit and a unit for filling the delivery chamber 219a with a high-purity inert gas, which are not shown. The sealing chamber 219b is a chamber for providing a sealant covering a deposition film deposited over the substrate 10; the sealant protects the deposition film against the atmosphere.

The first to sixth deposition chambers 213 to 218 are provided with respective buffer portions 213a to 218a via which respective adjacent chambers are connected thereto. By providing the buffer portion, a deposition material incoming from the adjacent evaporation chamber can be prevented from entering the film under deposition. The first to sixth deposition chambers 213 to 218 are each provided with a unit for transferring a substrate and an evacuation unit, though not shown.

The first to the fifth deposition chambers 213 to 217 are each provided with a linear deposition source. In addition, the sixth deposition chamber 218 may be provided with a linear deposition source, a point-source-type deposition source, or a sputtering deposition apparatus.

The linear deposition source is an evaporation source which heats and vaporizes a deposition material, and is long in one direction. A top view and a side view of the deposition chamber provided with the linear deposition source are FIGS. 1B and 1C, respectively. The longitudinal direction of the linear deposition source described in this embodiment as an example is orthogonal to the direction in which the substrate is transferred, and is longer than or equal to the width of the substrate (the length of the side of the substrate, which is orthogonal to the direction in which the substrate is transferred). With such a structure of the deposition source, the deposition material can be diffused to vaporize more in the width direction of the substrate than in the longitudinal direction, and a film can be deposited over an entire surface of the substrate by transferring the substrate in one direction.

Figure 1B:
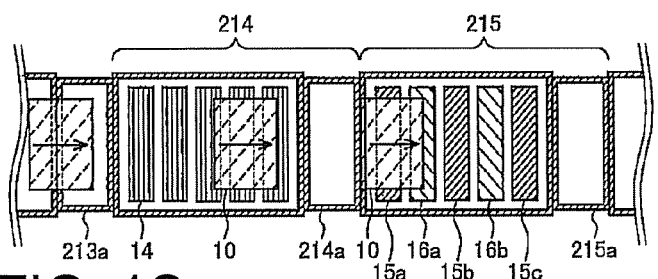
FIG. 1B is a top view of part of the in-line successive deposition apparatus shown in FIG. 1A.
Figure 1C:
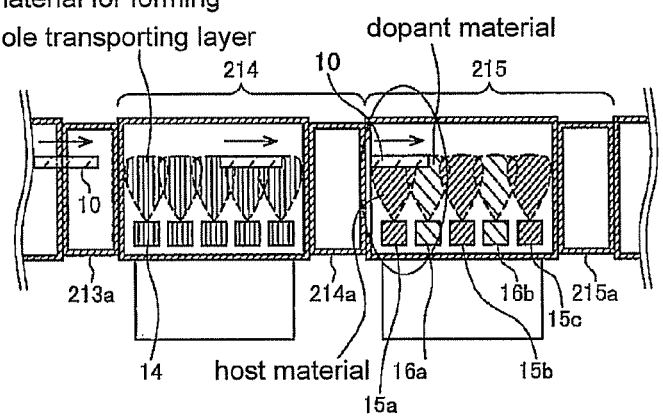
FIG. 1C is a side view of the part of the in-line successive deposition apparatus shown in FIG. 1B.

Specific description thereof is given below. In the first deposition chamber 213, first and second deposition sources 12 and 13 are arranged alternately in the direction in which the substrate 10 is transferred (direction indicated by an arrow) (FIG. 1A). In the second deposition chamber 214, a plurality of third deposition sources 14 is arranged in the direction in which the substrate 10 is transferred (FIGS. 1A to 1C). In the third deposition chamber 215, a fourth deposition source 15a, 15b, 15c and a fifth deposition source 16a, 16b are arranged alternately in the direction in which the substrate 10 is transferred (FIGS. 1A to 1C). In the fourth deposition chamber 216, a plurality of seventh deposition sources 17 is arranged in the direction in which the substrate 10 is transferred (FIG. 1A). In the fifth deposition chamber 217, a plurality of eighth deposition sources 18 is arranged in the direction in which the substrate 10 is transferred (FIG. 1A).

Figure 2:
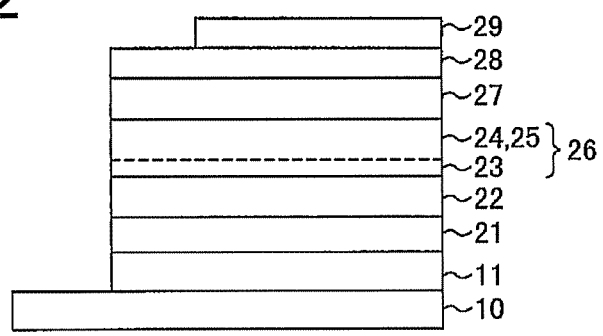
FIG. 2 is a cross-sectional diagram illustrating a structure of films deposited with the in-line successive deposition apparatus shown in FIGS. 1A to 1D.

A structure of films deposited with the in-line successive deposition apparatus described as an example in this embodiment is described in conjunction with FIG. 2. In particular, described are deposition of a film containing a single material and deposition of a film containing a plurality of materials.

Figure 1D:
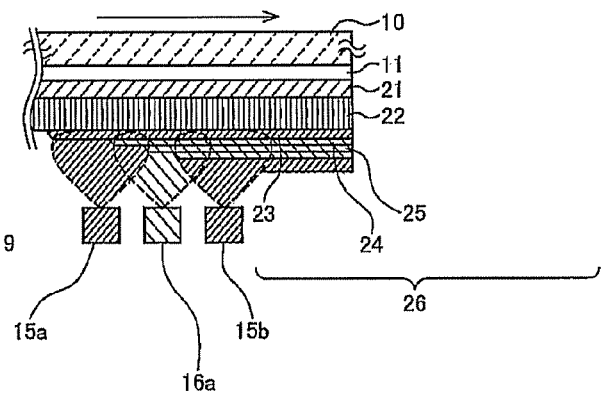
FIG. 1D is a cross-sectional diagram illustrating deposition of a light-emitting layer in deposition chamber 215 shown in FIG. 1C.

Further, deposition of a film containing a single material contained in the second deposition chamber 214 and deposition of a film containing a host material and a dopant material contained in the third deposition chamber 215 are described in detail using the side view of the in-line successive deposition apparatus (FIG. 1C) and a cross-sectional diagram of the substrate (FIG. 1D).

The substrate 10 is transferred into the first deposition chamber 213 from the pre-processing chamber 212b, and a hole-injection layer 21 is deposited over the first electrode 11 which is formed over the substrate 10 in advance, with the first and second deposition sources 12 and 13 (FIG. 2 and FIG. 1D). In this embodiment, the first deposition source 12 contains molybdenum oxide as an acceptor type material, and the second deposition source 13 contains a material whose hole-transport property is high.

In one embodiment of the present invention, the HOMO level of a material for forming a hole-transport layer 22 is adjusted to that of a host material; thus, hole transport from an anode to the hole-transport layer 22 might be lessened, though hole transport from the hole-transport layer 22 to a light-emitting layer 26 is smooth. In that case, it is preferable to use a composite material of an acceptor type material and a material whose hole-transport property is high for the hole-injection layer 21 as described in this embodiment. That composite material facilitates hole transport from the anode to the hole-transport layer 22 in the light-emitting element.

The second deposition chamber 214 includes 5 third deposition sources 14 for example, which are deposition sources of the same material for forming a hole-transport layer. The substrate 10 is transferred therein by the transfer unit from left to right in the drawing, so that the hole-transport layer 22 is deposited over the hole-injection layer 21. With the above-described structure of the second deposition chamber 214, a deposition film can be deposited to have a uniform composition, and the thickness thereof is proportional to the deposition rate of each deposition source 14 and is inversely proportional to the transfer speed of the substrate 10.

The third deposition chamber 215 includes 5 linear deposition sources, for example. In this embodiment, 3 fourth deposition sources 15a to 15c each contain a host material, and 2 fifth deposition sources 16a and 16b each contain a dopant material which is a light-emitting substance. The HOMO level of the host material contained in each of the fourth deposition sources 15a to 15c is adjusted to that of the material for the hole-transport layer contained in the third deposition source 14. Further, it is preferable that the HOMO level of the host material be adjusted to that of the material whose hole-transport property is high contained in the hole-injection layer 21 in order to suppress an increase in the driving voltage of the light-emitting element. The substrate 10 is transferred therein by the transfer unit from left to right in the drawing.

In the third deposition chamber 215 with the above-described structure, the light-emitting layer 26 having a composition in which the host material and the dopant material are mixed can be deposited over the substrate 10. The composition of the light-emitting layer 26 is determined by the ratio of deposition rate of the deposition source 15a, 15b, 15c of the host material to deposition rate of the deposition source 16a, 16b of the dopant material. That deposition method of depositing one film from different materials with different deposition sources is one mode of a co-deposition method.

The structure of the light-emitting layer 26 deposited with the fourth deposition sources 15a to 15c and the fifth deposition sources 16a and 16b in the third deposition chamber 215 is described using FIG. 1D. The position of the fourth deposition source 15a, 15b, 15c and the position of the fifth deposition source 16a, 16b cannot be consolidated because their deposition materials are different from each other. Consequently, those two deposition materials cannot be mixed uniformly at some positions. In particular, with the fourth deposition source 15a, which is the first placed on the side from which the substrate 10 is transferred into the third deposition chamber 215, a film containing only the deposition material (host material) of the fourth deposition source 15a is deposited over the substrate 10 because there is no deposition source on the side thereof in the third deposition chamber 215, from which the substrate 10 is transferred into.

Specifically, in the third deposition chamber 215, a host material layer 23 containing only the host material is deposited with the fourth deposition source 15*a* so as to be in contact with the film (e.g. hole-transport layer 22) deposited in the second deposition chamber 214.

Then, the substrate 10 is further transferred in the third deposition chamber 215, so that the dopant material is deposited thereover with the fifth deposition source 16*a*. Since the fifth deposition source 16*a* is provided between the fourth deposition sources 15*a* and 15*b* each of which contains the host material, a composite material layer 24 in which the host material and the dopant material are mixed is mainly deposited. Depending on the distance between the fourth deposition source 15*a* and the fifth deposition source 16*a*, the distance between the fifth deposition source 16*a* and the fourth deposition source 15*b*, the distance between the fourth deposition source 15*b* and the fifth deposition source 16*b*, and the distance between the fifth deposition source 16*b* and the fourth deposition source 15*c*, a dopant material layer 25 may be deposited in addition to the composite material layer 24. In this manner, the host material layer 23 is deposited over the hole-transport layer 22, and the composite material layer 24 is deposited over the host material layer 23 (FIG. 2 and FIG. 1D).

Next, the substrate 10 is transferred from the third deposition chamber 215 into the fourth deposition chamber 216 illustrated as an example, and an electron-transport layer 27 is deposited over the light-emitting layer 26 with the seventh deposition sources 17 (FIG. 2).

Next, the substrate 10 is transferred from the fourth deposition chamber 216 to the fifth deposition chamber 217 illustrated as an example, and an electron-injection layer 28 is deposited over the electron-transport layer 27 with the eighth deposition sources 18 (see FIG. 2).

Next, in the sixth deposition chamber 218 illustrated as an example, a second electrode 29 is deposited over the electron-injection layer 28.

Figure 3:
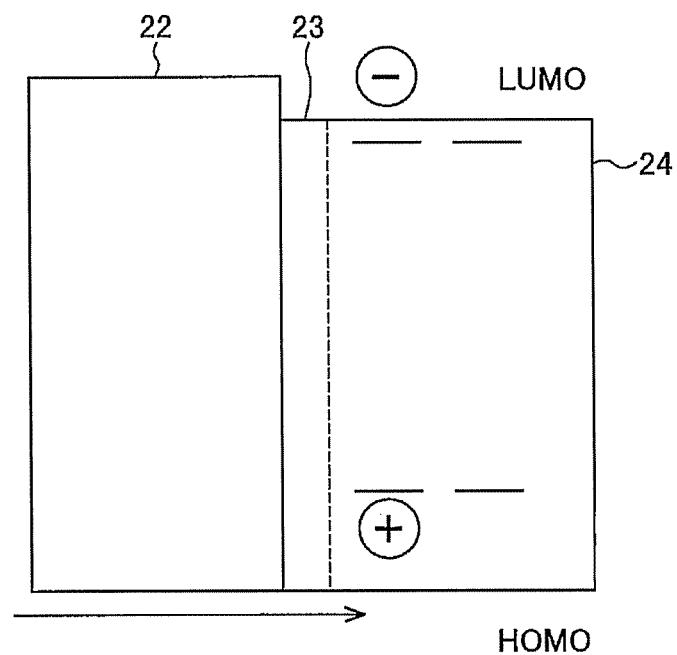
FIG. 3 is a pattern diagram illustrating HOMO levels of respective materials of hole-transport layer 22, host material layer 23, and composite material layer 24 shown in FIG. 1D.

FIG. 3 is a pattern diagram illustrating HOMO levels of respective materials of the hole-transport layer 22, the host material layer 23, and the composite material layer 24 shown in FIG. 1D. According to this embodiment, the fourth deposition source 15*a* provided upstream in the third deposition chamber 215 can deposit the host material layer 23 between the hole-transport layer 22 and the composite material layer 24, whereby deposition of a single layer containing only a light-emitting substance (dopant material layer) between the hole-transport layer 22 and the composite material layer 24 can be suppressed even in high-speed deposition (e.g. at a deposition rate of 3 nm/sec and/or a deposition time of 10 sec/layer). Further, since the HOMO level of the host material of each of the fourth deposition sources 15*a* to 15*c* is adjusted to that of the material for the hole-transport layer of the third deposition source 14, hole injection from the hole-transport layer 22 to the light-emitting layer 26 is facilitated, whereby a reduction in the luminous efficiency of the light-emitting layer 26 can be suppressed.

In this specification and the like, the definition of being "adjusted to" in the case where the HOMO level of the host material is adjusted to that of the material for the hole-transport layer includes not only the meaning of setting to be the same level but also the meaning of setting to a level at which holes can be injected readily from the hole-transport layer 22 to the light-emitting layer 26. Specifically, the case where the absolute value of the difference between the HOMO level of the host material and that of the material for the hole-transport layer is less than or equal to 0.2 eV, preferably less than or equal to 0.1 eV falls within that definition.

(Embodiment 2)

This embodiment is described in conjunction with FIGS. 4A to 4D, FIG. 5, and FIG. 6, in which portions which are the same as those in FIGS. 1A to 1D, FIG. 2, and FIG. 3 are denoted by the respective same reference symbols and description thereof is not repeated.

Figure 4A:
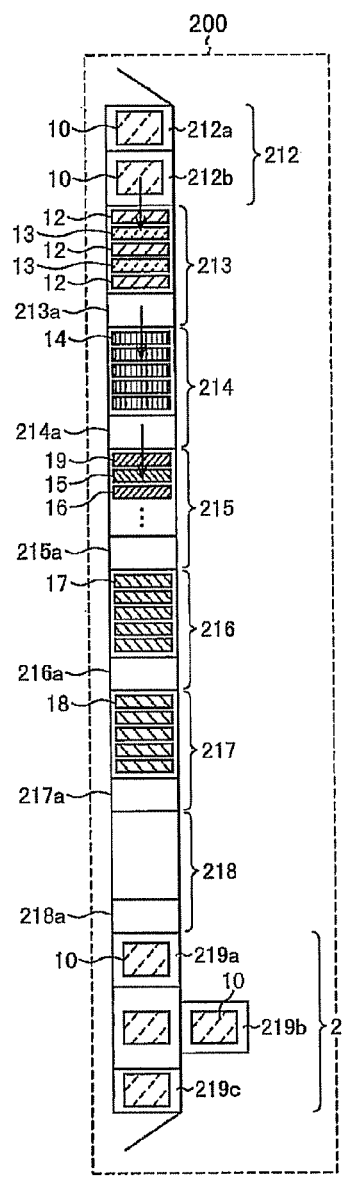
FIG. 4A is a schematic plane view of an entire structure of an in-line successive deposition apparatus according to one embodiment of the present invention.

A full view of an in-line successive deposition apparatus that is an apparatus for manufacturing a light-emitting element according to this embodiment is FIG. 4A. A top view and a side view of a deposition chamber provided with a linear deposition source are FIGS. 4B and 4C, respectively.

Figure 4B:
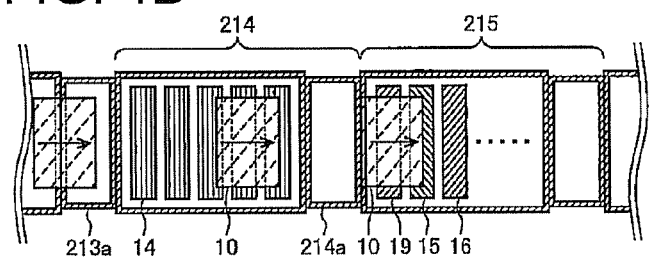
FIG. 4B is a top view of part of the in-line successive deposition apparatus shown in FIG. 4A.
Figure 4C:
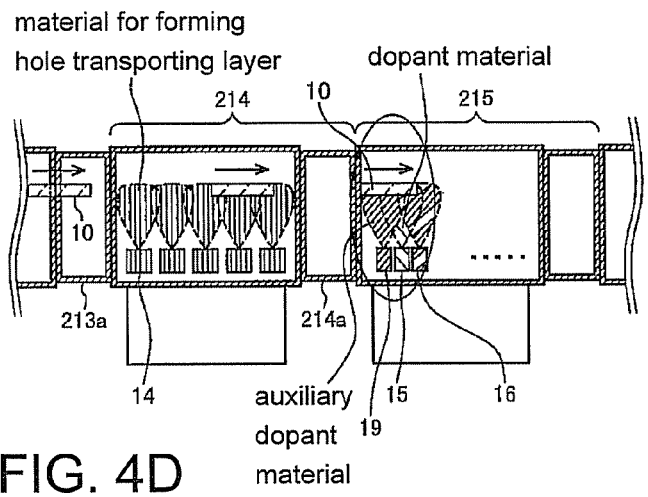
FIG. 4C is a side view of the part of the in-line successive deposition apparatus shown in FIG. 4B.

In a third deposition chamber 215, a plurality of sets in each of which a fourth deposition source 19, a fifth deposition source 15, and a sixth deposition source 16 are arranged in this order is arranged in the direction in which a substrate 10 is transferred (FIGS. 4A to 4C).

Figure 5:
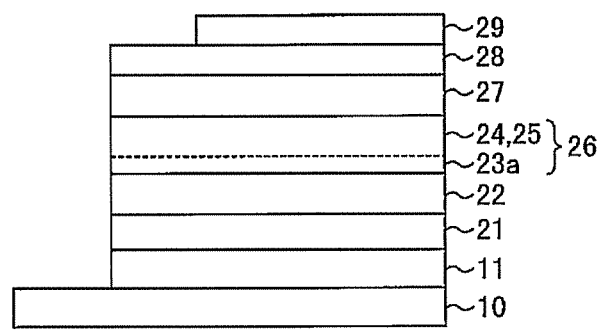
FIG. 5 is a cross-sectional diagram illustrating a structure of films deposited with the in-line successive deposition apparatus shown in FIGS. 4A to 4D.

A structure of films deposited with the in-line successive deposition apparatus described as an example in this embodiment is described in conjunction with FIG. 5. In particular, described are deposition of a film containing a single material and deposition of a film containing a plurality of materials.

Figure 4D:
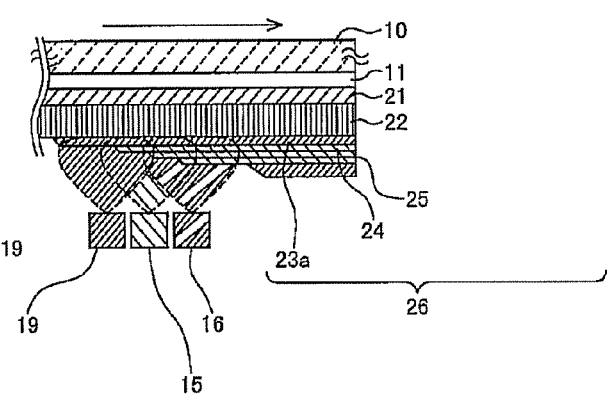
FIG. 4D is a cross-sectional diagram illustrating deposition of a light-emitting layer in deposition chamber 215 shown in FIG. 4C.

Further, deposition of a film containing a single material in a second deposition chamber 214 and deposition of a film containing a host material, an auxiliary dopant material, and a dopant material in the third deposition chamber 215 are described in detail using the side view of the in-line successive deposition apparatus (FIG. 4C) and a cross-sectional diagram of the substrate (FIG. 4D).

The substrate 10 is transferred into a first deposition chamber 213 from a pre-processing chamber 212*b*, and a hole-injection layer 21 is deposited over a first electrode 11 which is formed over the substrate 10 in advance, with first and second deposition sources 12 and 13 (FIG. 5 and FIG. 4D). In this embodiment, the first deposition source 12 contains molybdenum oxide as an acceptor type material, and the second deposition source 13 contains a material whose hole-transport property is high. A mixed layer deposited with the first deposition source 12 and the second deposition source 13 can be used as a hole-injection layer.

The second deposition chamber 214 includes 5 third deposition sources 14 for example, which are deposition sources of the same material for forming a hole-transport layer. The substrate 10 is transferred therein by a transfer unit from left to right in the drawing, so that a hole-transport layer 22 is deposited over the hole-injection layer 21.

The third deposition chamber 215 includes at least 6 linear deposition sources, for example. In this embodiment, 2 fourth deposition sources 19 each of which contains an auxiliary dopant material, 2 fifth deposition sources 15 each of which contains a dopant material which is a light-emitting substance, and 2 sixth deposition sources 16 each of which contains a host material. The HOMO level of the auxiliary dopant material contained in each of the fourth deposition sources 19 is adjusted to that of the material for the hole-transport layer contained in the third deposition source 14. The substrate 10 is transferred therein by a transfer unit from left to right in the drawing In the third deposition chamber 215 with the above-described structure, a light-emitting layer having a composition in which the host material, the auxiliary dopant material, and the dopant material are mixed can be deposited over the hole-transport layer 22 deposited over the substrate 10. The composition of the light-emitting layer is determined by the ratio of respective deposition rates of the deposition source 16 of the host material, the deposition source 15 of the dopant material, and the deposition source 19 of the auxiliary dopant material.

The structure of a light-emitting layer 26 deposited with the fourth deposition sources 19, the fifth deposition sources 15, and the sixth deposition source 16 in the third deposition chamber 215 is described using FIG. 4D. The positions of the fourth deposition sources 19, the fifth deposition sources 15, and the sixth deposition source 16 cannot be consolidated because their deposition materials are different from each other. Consequently, those three deposition materials cannot be mixed uniformly at some positions. In particular, with the fourth deposition source 19, which is the first placed on the side from which the substrate 10 is transferred into the third deposition chamber 215, a film containing only the deposition material (auxiliary dopant material) of the fourth deposition source 19 is deposited over the substrate 10 because there is no deposition source on the side thereof in the third deposition chamber 215, from which the substrate 10 is transferred into.

Specifically, in the third deposition chamber 215, an auxiliary dopant material layer 23a containing only the auxiliary dopant material is deposited with the fourth deposition source 19 so as to be in contact with the film (e.g. hole-transport layer 22) deposited in the second deposition chamber 214.

Then, the substrate 10 is further transferred in the third deposition chamber 215, so that the dopant material and the host material are deposited thereover with the fifth deposition source 15 and the sixth deposition source 16. Since the fourth deposition source 19 which contains the auxiliary dopant material, the fifth deposition source 15 which contains the dopant material, and the sixth deposition source 16 which contains the host material are arranged sequentially, a composite material layer 24 in which the host material, the auxiliary dopant material, and the dopant material are mixed is mainly deposited. Depending on the distance between the fourth deposition source 19 and the fifth deposition source 15, and the distance between the fifth deposition source 15 and the sixth deposition source 16, a dopant material layer 25 may be deposited in addition to the composite material layer 24. In this manner, the auxiliary dopant material layer 23a is deposited over the hole-transport layer 22, and the composite material layer 24 is deposited over the auxiliary dopant material layer 23a (FIG. 5 and FIG. 4D).

Next, the substrate 10 is transferred from the third deposition chamber 215 to the fourth deposition chamber 216, the fifth deposition chamber 217, and the sixth deposition chamber 218 in this order in the similar manner to Embodiment 1, so that an electron-transport layer 27 is deposited over the light-emitting layer 26 with a seventh deposition source 17, an electron-injection layer 28 is deposited over the electron-transport layer 27 with an eighth deposition source 18, and a second electrode 29 is deposited over the electron-injection layer 28 (see FIG. 5).

Figure 6:
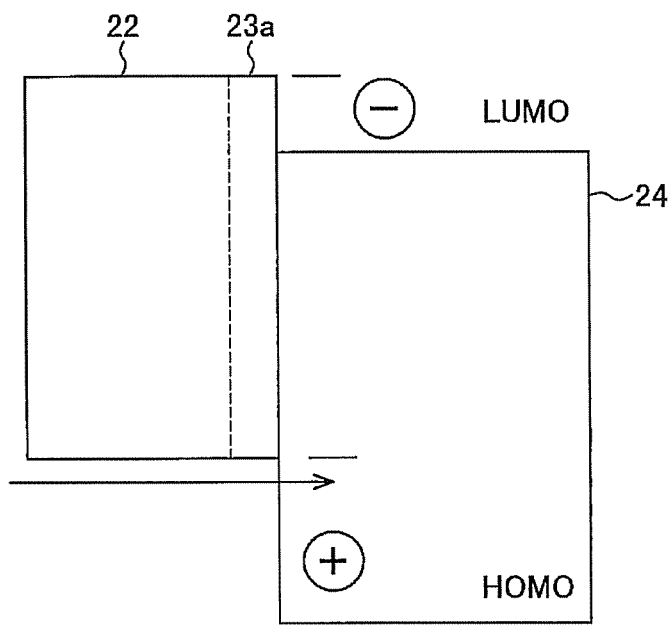
FIG. 6 is a pattern diagram illustrating HOMO levels of respective materials of hole-transport layer 22, auxiliary dopant material layer 23a, and composite material layer 24 shown in FIG. 4D.

FIG. 6 is a pattern diagram illustrating HOMO levels of respective materials of the hole-transport layer 22, the auxiliary dopant material layer 23a, and the composite material layer 24 shown in FIG. 4D. According to this embodiment, the fourth deposition source 19 containing the auxiliary dopant material, which is provided upstream in the third deposition chamber 215 where the light-emitting layer is deposited, can deposit auxiliary dopant material layer 23a between the hole-transport layer 22 and the composite material layer 24, whereby deposition of a single layer containing only a host material (host material layer) between the hole-transport layer 22 and the composite material layer 24 can be suppressed even in high-speed deposition (e.g. at a deposition rate of 3 nm/sec and/or a deposition time of 10 sec/layer). Further, since the HOMO level of the auxiliary dopant material of the fourth deposition source 19 is adjusted to that of the material for the hole-injection layer of the third deposition source 14, the HOMO level of the auxiliary dopant material layer 23a can be adjusted to that of the hole-transport layer 22. Consequently, the auxiliary dopant material layer 23a whose hole-transport property is high can be deposited, by which the auxiliary dopant mixed in the light-emitting layer 26 forms a level having a hole-acceptance property attributed to its HOMO level to facilitate hole injection from the hole-transport layer 22 to the light-emitting layer 26; accordingly, an increase in the driving voltage of the light-emitting layer 26 can be suppressed.

In this specification and the like, the definition of being "adjusted to" in the case where the HOMO level of the auxiliary dopant material is adjusted to that of the material for the hole-injection layer includes not only the meaning of setting to the same level but also the meaning of setting to a level at which holes can be injected readily from the hole-transport layer 22 to the light-emitting layer 26. Specifically, the case where the absolute value of the difference between the HOMO level of the auxiliary dopant material and that of the material for the hole-transport layer is less than or equal to 0.2 eV, preferably less than or equal to 0.1 eV falls within that definition.

(Embodiment 3)

In this embodiment, examples of a structure of a light-emitting element which can be manufactured with the successive deposition apparatus of one embodiment of the present invention are described in conjunction with FIGS. 7A to 7C and FIGS. 8A and 8B. In any of the structures of the light-emitting element, by applying one embodiment (e.g. Embodiment 1) of the present invention, a reduction in the luminous efficiency of the light-emitting element can be suppressed even in high-speed deposition of a light-emitting layer thereof. Further, in any of the structures of the light-emitting element, by applying one embodiment (e.g. Embodiment 2) of the present invention, hole injection from a single layer, which contains a single material and is formed between a first deposition layer and a second deposition layer, to the light-emitting layer can be facilitated by adjusting the HOMO level of the material for forming the single layer to that of a material for forming the first deposition layer and by mixing the material for forming the single layer in the second deposition layer. Still further, by applying one embodiment (e.g. Embodiment 2) of the present invention, an increase in the driving voltage of the light-emitting element can be suppressed even in high-speed deposition of the light-emitting layer thereof. Further, by applying one embodiment (e.g. Embodiment 2) of the present invention, a reduction in the luminous efficiency of the light-emitting element can be suppressed even in high-speed deposition of the light-emitting layer thereof.

Note that the number of deposition chambers and details on a deposition source of the successive deposition apparatus can be adjusted in accordance with the number of EL layers of the light-emitting element.

A light-emitting element described as an example in this embodiment includes a first electrode, a second electrode, and an EL layer. The first electrode which is formed over a substrate serves as an anode and the second electrode serves as a cathode. The EL layer is provided between the first electrode and the second electrode, and a structure of the EL layer may be appropriately selected in accordance with materials of the first electrode and the second electrode. Examples of the structure of the light-emitting element are described below; it is needless to say that the structure of the light-emitting element is not limited thereto.

\<Structure Example 1 of Light-Emitting Element>

Figure 7A:
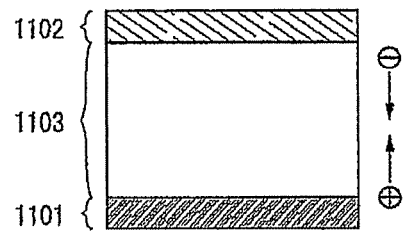
FIGS. 7A and 7B are cross-sectional diagrams each illustrating Structure Example 1 of a light-emitting element according to one embodiment of the present invention.

An example of the structure of the light-emitting element is illustrated in FIG. 7A. In the light-emitting element illustrated in FIG. 7A, an EL layer 1103 is provided between an anode 1101 and a cathode 1102.

When a voltage higher than the threshold voltage of the light-emitting element is applied between the anode 1101 and the cathode 1102, holes are injected to the EL layer 1103 from the anode 1101 and electrons are injected to the EL layer 1103 from the cathode 1102. The injected electrons and holes are recombined in the EL layer 1103, so that a light-emitting substance contained in the EL layer 1103 emits light.

The EL layer 1103 includes at least a light-emitting layer containing the light-emitting substance, and may further include any another layer stacked on the light-emitting layer. Examples of the layer stacked on the light-emitting layer are layers containing a substance having a high hole-injection property, a substance having a high hole-transport property, a substance having a poor hole-transport property (a substance which blocks holes), a substance having a high electron-transport property, a substance having a high electron-injection property, and a substance having a bipolar property (a substance having high electron-and-hole-transport properties).

Figure 7B:
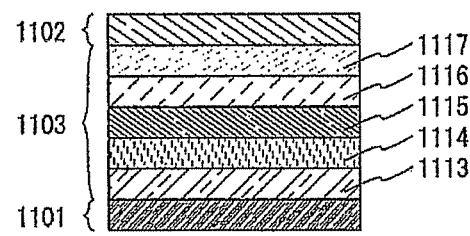

An example of a specific structure of the EL layer 1103 is illustrated in FIG. 7B. The EL layer 1103 illustrated in FIG. 7B has a structure in which a hole-injection layer 1113, a hole-transport layer 1114, a light-emitting layer 1115, an electron-transport layer 1116, and an electron-injection layer 1117 are stacked in this order from the anode 1101 side.

\<Structure Example 2 of Light-Emitting Element>

Figure 7C:
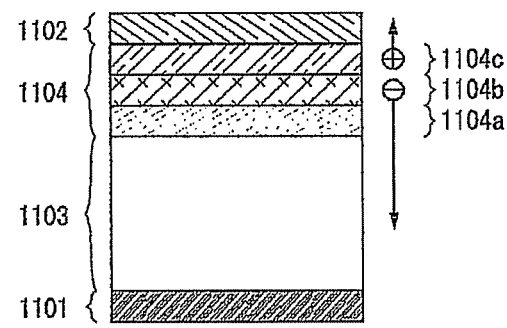
FIG. 7C is a cross-sectional diagram illustrating Structure Example 2 of a light-emitting element according to one embodiment of the present invention.

Another example of the structure of the light-emitting element is illustrated in FIG. 7C. In the light-emitting element illustrated in FIG. 7C, an EL layer 1103 is provided between an anode 1101 and a cathode 1102. Further, an intermediate layer 1104 is provided between the cathode 1102 and the EL layer 1103. Note that a structure similar to that of the light-emitting element in Structure Example 1 can be applied to the EL layer 1103 of the light-emitting element in Structure Example 2, and for the details, the description of Structure Example 1 can be referred to.

The intermediate layer 1104 is formed to include at least a charge generation region, and may further include any other layer stacked on the charge generation region. For example, a structure can be employed in which a first charge generation region 1104c, an electron-relay layer 1104b, and an electron-injection buffer 1104a are stacked in this order from the cathode 1102 side.

The behaviors of electrons and holes in the intermediate layer 1104 are described below. When a voltage higher than the threshold voltage of the light-emitting element is applied between the anode 1101 and the cathode 1102, holes and electrons are generated in a first charge generation region 1104c, and the holes move into the cathode 1102 and the electrons move into the electron-relay layer 1104b. An electron-relay layer 1104b has a high electron-transport property and immediately transfers electrons generated in the first charge generation region 1104c to an electron-injection buffer 1104a. The electron-injection buffer 1104a lowers a barrier in injection of electrons into the EL layer 1103, whereby the efficiency of electron injection into the EL layer 1103 is improved. In this manner, electrons generated in the first charge generation region 1104c are injected into the LUMO (lowest unoccupied molecular orbital) level of the EL layer 1103 through the electron-relay layer 1104b and the electron-injection buffer 1104a.

In addition, the electron-relay layer 1104b can prevent interaction; for example, a reaction of a substance contained in the first charge generation region 1104c and a substance contained in the electron-injection buffer 1104a at the interface therebetween to damage their functions can be prevented.

\<Structure Example 3 of Light-Emitting Element>

Figure 8A:
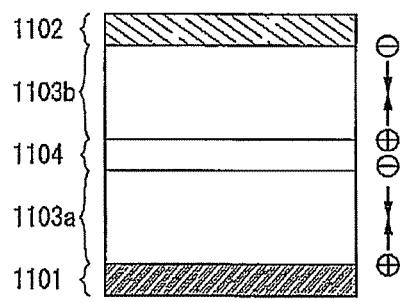
FIGS. 8A and 8B are cross-sectional diagrams each illustrating Structure Example 3 of a light-emitting element according to one embodiment of the present invention.

Another example of the structure of the light-emitting element is illustrated in FIG. 8A. In the light-emitting element illustrated in FIG. 8A, two EL layers are provided between an anode 1101 and a cathode 1102. Further, an intermediate layer 1104 is provided between an EL layer 1103a and an EL layer 1103b.

Figure 8B:
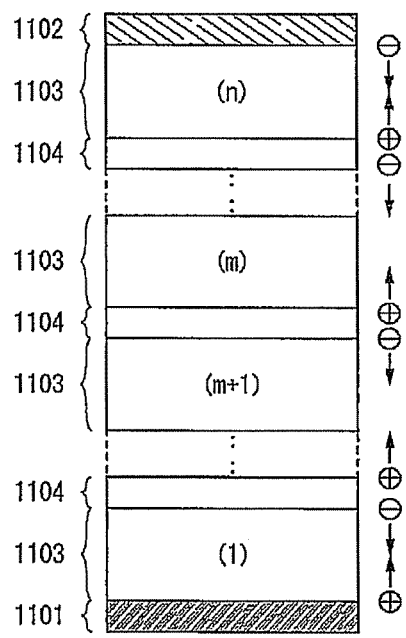

The number of EL layers provided between the anode and the cathode is not limited to two. A light-emitting element which is illustrated in FIG. 8B has a structure in which a plurality of EL layers 1103 are stacked, that is, a stacked-layer element structure. Note that in the case where n (n is a natural number of 2 or more) EL layers 1103 are provided between the anode and the cathode, an intermediate layer 1104 is provided between the m-th (m is a natural number greater than or equal to 1 and less than or equal to n−1) EL layer and the (m+1)th EL layer.

Note that a structure similar to that of the light-emitting element in Structure Example 1 can be applied to the EL layer 1103 of the light-emitting element in Structure Example 3; a structure similar to that of the light-emitting element in Structure Example 2 can be applied to the intermediate layer 1104 of the light-emitting element in Structure Example 3. As such, for the details, the description of Structure Example 1 or Structure Example 2 can be referred to.

The behaviors of electrons and holes in the intermediate layer 1104 provided between the EL layers are described below. When a voltage higher than the threshold voltage of the light-emitting element is applied between the anode 1101 and the cathode 1102, holes and electrons are generated in the intermediate layer 1104, and the holes move into the EL layer positioned on the cathode 1102 side and the electrons move into the EL layer positioned on the anode 1101 side. The holes injected into the EL layer on the cathode side are recombined with electrons injected from the cathode, so that a light-emitting substance contained in the EL layer emits light. On the other hand, the electrons injected into the EL layer on the anode side are recombined with holes injected from the anode, so that a light-emitting substance contained in the EL layer emits light. Thus, holes and electrons generated in the intermediate layer 1104 lead to light emission in different EL layers.

Note that in the case of employing a structure which is the same as an intermediate layer formed between EL layers by providing the EL layers to be in contact with each other, the EL layers can be provided in contact with each other. Specifically, a charge generation region can be formed in one surface of the EL layer, so that the charge generation region functions as a first charge generation region of an intermediate layer; thus, the EL layers can be provided to be in contact with each other.

Structure Examples 1 to 3 can be implemented in combination. For example, an intermediate layer may be provided between the cathode and the EL layer in the light-emitting element in Structure Example 3.

\<Specific Example 1 of Light-Emitting Element>

Next, one example of the light-emitting element which can be manufactured with the successive deposition apparatus of one embodiment (e.g., Embodiment 1) of the present invention is described. Chemical formulae of materials used in the element are shown below.

[Chemical Formulae 1]

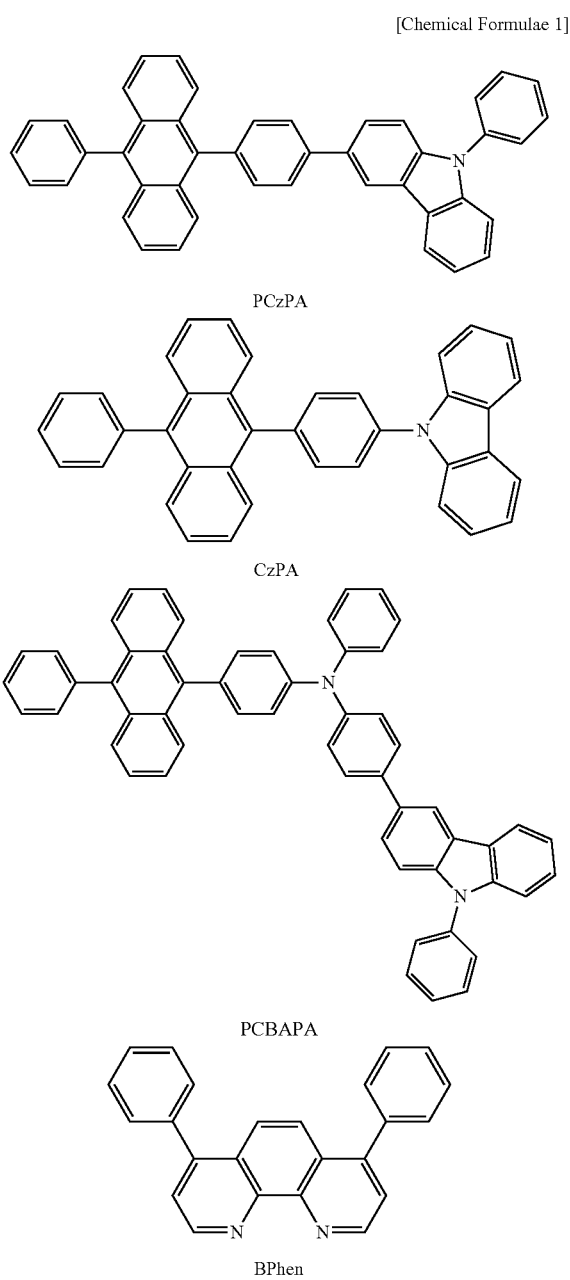

PCzPA

CzPA

PCBAPA

BPhen

The light-emitting element described below includes a first electrode, a hole-injection layer, a hole-transport layer, a light-emitting layer, a first electron-transport layer, a second electron-transport layer, an electron-injection layer, and a second electrode which are sequentially formed over a substrate.

The first electrode is formed of indium tin oxide containing silicon oxide (ITSO) with a thickness of 110 nm.

The hole-injection layer is formed by co-evaporating 9-phenyl-3-[4-(10-phenyl-9-anthryl)phenyl]-9H-carbazole (abbreviation: PCzPA) and molybdenum(VI) oxide. The thickness of the hole-injection layer is 70 nm, and the weight ratio of PCzPA to molybdenum(VI) oxide is adjusted, to 4:2 (=PCzPA:molybdenum oxide).

The hole-transport layer is formed of PCzPA with a thickness of 30 nm.

The light-emitting layer is formed by co-evaporating 9-[4-(10-phenyl-9-anthryl)phenyl]-9H-carbazole (abbreviation: CzPA) and 4-(10-phenyl-9-anthryl)-4'-(9-phenyl-9H-carbazol-3-yl)triphenylamine (abbreviation: PCBAPA). The thickness of the light-emitting layer is 20 nm, and the weight ratio of CzPA to PCBAPA is adjusted to 1:0.05 (=CzPA:PCBAPA).

In a deposition chamber where the light-emitting layer is deposited, a deposition source containing CzPA is the first placed on the side from which the substrate is transferred into. Therefore, in that deposition chamber, a host material layer containing only CzPA that is a host material is first deposited in contact with the hole-transport layer with the deposition source.

Then, the substrate is further transferred in the deposition chamber, so that a composite material layer in which CzPA that is a host material and PCBAPA that is a dopant material are mixed is mainly deposited thereover.

The first electron-transport layer is foil led of CzPA with a thickness of 10 nm.

The second electron-transport layer is formed of bathophenanthroline (abbreviation: BPhen) with a thickness of 15 nm.

The electron-injection layer is formed of lithium fluoride (LiF) with a thickness of 1 nm.

The second electrode is formed of aluminum with a thickness of 200 nm.

In the above-described light-emitting element manufactured with the successive deposition apparatus of one embodiment of the present invention, a single layer containing a single material (which corresponds to the host material layer) is formed between the hole-transport layer and the light-emitting layer. The hole-transport layer contains PCzPA having a HOMO level of −5.79 eV; the single layer contains CzPA having a HOMO level of −5.79 eV; and the light-emitting layer also contains CzPA as a host material. In this manner, the HOMO level of the single material (CzPA) of the single layer is adjusted to that of the material (PCzPA) of the hole-transport layer.

In this manner, according to one embodiment of the present invention, the single layer of the host material for the light-emitting layer is deposited between the hole-transport layer and the light-emitting layer, whereby formation of a single layer of a light-emitting substance can be prevented, so that a reduction in the luminous efficiency of a light-emitting element (concentration quenching) can be suppressed. Further, since the HOMO level of the host material of the single layer is adjusted to that of the material of the hole-transport layer, hole transport to the light-emitting layer is smooth, so that an increase in the driving voltage of the light-emitting element or a reduction in luminous efficiency can be suppressed. As described above, according to one embodiment of the present invention, a reduction in the luminous efficiency of the light-emitting element can be suppressed even in high-speed deposition of the light-emitting layer.

<Specific Example 2 of Light-Emitting Element>

Next, another example of the light-emitting element which can be manufactured with the successive deposition apparatus of one embodiment (e.g., Embodiment 2) of the present invention is described. Chemical formulae of materials used in the element are shown below.

[Chemical Formulae 2]

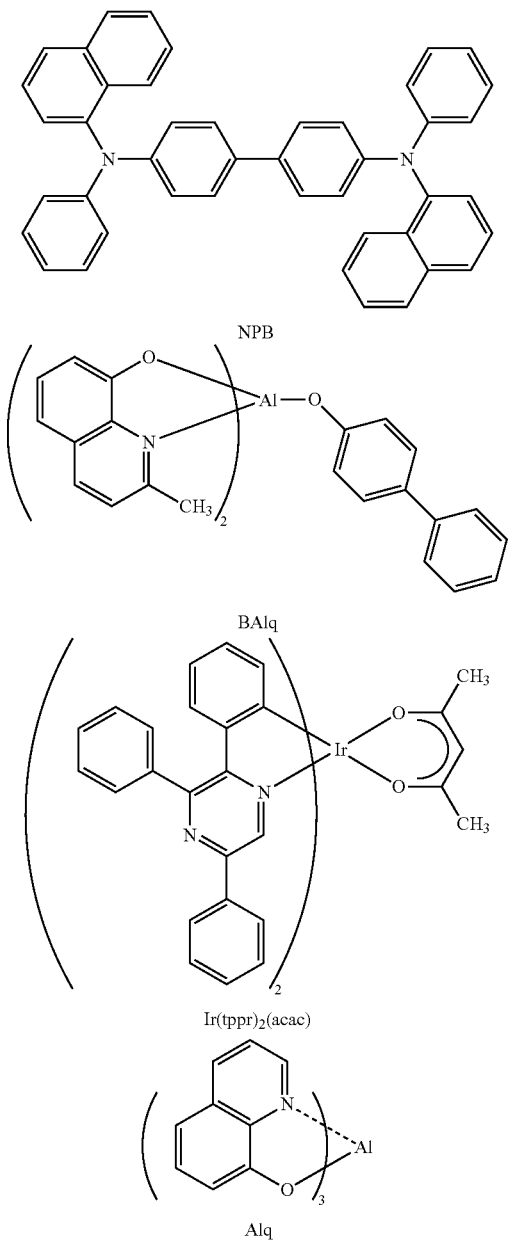

NPB

BAlq

Ir(tppr)₂(acac)

Alq

The light-emitting element described below includes a first electrode, a hole-injection layer, a hole-transport layer, a light-emitting layer, an electron-transport layer, an electron-injection layer, and a second electrode which are sequentially formed over a substrate.

The first electrode is formed of indium tin oxide containing silicon oxide (ITSO) with a thickness of 110 nm.

The hole-injection layer is formed by co-evaporating 4,4'-bis[N-(1-naphthyl)-N-phenylamino]biphenyl (abbreviation: NPB) and molybdenum(VI) oxide. The thickness of the hole-injection layer is 50 nm, and the weight ratio of NPB to molybdenum(VI) oxide is adjusted to 4:1 (=NPB:molybdenum oxide).

The hole-transport layer is formed of NPB with a thickness of 10 nm.

The light-emitting layer is formed by co-evaporating NPB as an auxiliary dopant material, bis(2-methyl-8-quinolinolato)(4-phenylphenolato)aluminum(III) (abbreviation: BAlq) as a host material, and (acetylacetonato)bis(2,3,5-triphenylpyrazinato)iridium(II) (abbreviation: Ir(tppr)₂(acac)) as a dopant material. The thickness of the light-emitting layer is 50 nm, and the weight ratio of NPB to BAlq to Ir(tppr)₂(acac) is adjusted to 0.1:1:0.06 (=NPB:BAlq:Ir(tppr)₂(acac)).

In a deposition chamber where the light-emitting layer is deposited, a deposition source containing NPB is the first placed on the side from which the substrate is transferred into. Therefore, in that deposition chamber, an auxiliary dopant material layer containing only NPB that is an auxiliary dopant material is first deposited in contact with the hole-transport layer with the deposition source.

Then, the substrate is further transferred in the deposition chamber, so that a composite material layer in which BAlq that is a host material and Ir(tppr)₂(acac) that is a dopant material are mixed is mainly deposited thereover.

The electron-transport layer is formed of tris(8-quinolinolato)aluminum(III) (abbreviation: Alq) with a thickness of 10 nm.

The electron-injection layer is formed by co-evaporating Alq and litium (Li). The thickness of the electron-injection layer is 20 nm, and the weight ratio of Alq to Li is adjusted to 1:0.01 (=Alq:Li).

The second electrode is formed of aluminum with a thickness of 200 nm.

In the above-described light-emitting element manufactured with the successive deposition apparatus of one embodiment of the present invention, a single layer containing a single material is formed between the hole-transport layer and the light-emitting layer. Each of the hole-transport layer and the single layer contains NPB having a HOMO level of −5.38 eV, and the light-emitting layer also contains NPB as an auxiliary dopant material. In this manner, the HOMO level of the single material (NPB) of the single layer is adjusted to that of the material (NPB) of the hole-transport layer, and the material (NPB) is mixed in the second deposition layer, whereby hole transport from the single layer to the light-emitting layer is facilitated. Further, according to one embodiment of the present invention, an increase in the driving voltage of the light-emitting element or a reduction in luminous efficiency can be suppressed even in high-speed deposition of the light-emitting layer.

EXPLANATION OF REFERENCE

10: substrate; 11: first electrode; 12: first deposition source; 13: second deposition source; 14: third deposition source; 15a, 15b, 15c: fourth deposition source; 15, 16a, 16b: fifth deposition source; 16: sixth deposition source; 17: seventh deposition source; 18: eighth deposition source; 19: fourth deposition source; 21: hole-injection layer; 22: hole-transport layer; 23: host material layer; 23a: auxiliary dopant material layer; 24: composite material layer; 25: dopant material layer; 26: light-emitting layer; 27: electron-transport layer; 28: electron-injection layer; 29: second electrode; 200: in-line successive deposition apparatus; 212: pre-processing portion; 212a: loader; 212b: pre-processing chamber; 213: first deposition chamber; 213a to 218a: buffer portion; 214: second deposition chamber; 215: third deposition chamber; 216: fourth deposition chamber; 217: fifth deposition chamber; 218: sixth deposition chamber; 219: post-processing portion; 219a: delivery chamber; 219b: sealing chamber; 219c: unloader This application is based on Japanese Patent Application serial nos. 2011055533 and 2011055534 filed with Japan Patent Office on Mar. 14, 2011 and Mar. 14, 2011, respectively, the entire contents of which are hereby incorporated by reference.

The invention claimed is:

1. A method for successive deposition, comprising:
   depositing a first deposition layer over a substrate with a first deposition source;
   depositing a second deposition layer over the first deposition layer with a second deposition source; and
   depositing a third deposition layer in which a material contained in the second deposition source is mixed with a material contained in a third deposition source over the second deposition layer with the second deposition source and the third deposition source,
   wherein a highest occupied molecular orbital (HOMO) level of the material contained in the second deposition source is adjusted to a highest occupied molecular orbital (HOMO) level of a material of the first deposition source, and
   wherein the second deposition layer includes only an auxiliary dopant material.

2. The method for successive deposition according to claim 1,
   wherein the material contained in the second deposition source is the auxiliary dopant material,
   wherein the third deposition layer is deposited with the second deposition source, the third deposition source, and a fourth deposition source,
   wherein the material contained in the third deposition source is a dopant material,
   wherein a material contained in the fourth deposition source is a host material, and
   wherein the third deposition layer is a layer in which the host material is mixed with the dopant material and the auxiliary dopant material.

3. The method for successive deposition according to claim 2,
   wherein the first deposition layer, the second deposition layer, and the third deposition layer are deposited while transferring the substrate from a first deposition chamber to a second deposition chamber,
   wherein the first deposition chamber includes the first deposition source,
   wherein the second deposition chamber includes the second deposition source, the third deposition source, and the fourth deposition source which are arranged in a direction in which the substrate is transferred, and
   wherein in the second deposition chamber, the second deposition source is placed nearest to the first deposition chamber.

4. The method for successive deposition according to claim 1,
   wherein the first deposition layer is a hole-transport layer, and
   wherein the third deposition layer is a light-emitting layer.

5. The method for successive deposition according to claim 1,
   wherein an electrode is formed over the substrate before the first deposition layer is deposited.

6. The method for successive deposition according to claim 1,
   wherein the auxiliary dopant material is 4,4'-bis[N-(1-naphthyl)-N-phenylamino]biphenyl (NPB).

* * * * *